Figure 1:
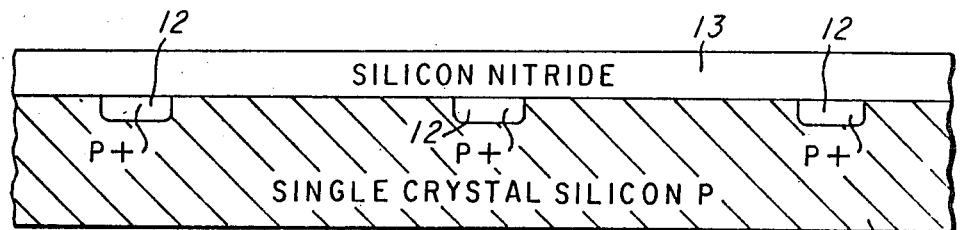

United States Patent [19]

Thompson et al.

[11] Patent Number: 4,462,847
[45] Date of Patent: Jul. 31, 1984

[54] FABRICATION OF DIELECTRICALLY ISOLATED MICROELECTRONIC SEMICONDUCTOR CIRCUITS UTILIZING SELECTIVE GROWTH BY LOW PRESSURE VAPOR DEPOSITION

[75] Inventors: Stephen W. Thompson, Rosenburg; Ralph Keen, Missouri City, both of Tex.

[73] Assignee: Texas Instruments Incorporated, Dallas, Tex.

[21] Appl. No.: 390,011

[22] Filed: Jun. 21, 1982

[51] Int. Cl.$^3$ ................ H01L 21/205; H01L 21/76
[52] U.S. Cl. ..................... 148/174; 29/576 E; 29/576 W; 29/578; 148/175; 156/612; 156/613; 156/614; 357/49; 357/50; 427/86
[58] Field of Search ............ 148/174, 175; 29/576 E, 29/576 W, 578; 156/612-614; 427/85, 86, 94; 357/49, 50

[56] References Cited

U.S. PATENT DOCUMENTS

| | | | |
|---|---|---|---|
| 3,156,591 | 11/1964 | Hale et al. | 148/175 |
| 3,651,385 | 3/1972 | Kobayashi | 357/59 |
| 3,796,613 | 3/1974 | Magdo et al. | 148/175 |
| 3,928,092 | 12/1975 | Ballamy et al. | 148/175 |
| 3,947,299 | 3/1976 | Weijland et al. | 148/175 X |
| 4,074,304 | 2/1978 | Shiba | 357/49 X |
| 4,101,350 | 7/1978 | Possley et al. | 29/578 X |

OTHER PUBLICATIONS

Chang et al., "Fabrication for Junction Insulating Gate FET", I.B.M. Tech. Discl. Bull., vol. 13, No. 9, Feb. 1971, p. 2503.
"Schnelle I$^2$L-Schaltung", Neues Aus der Technik, Aug. 15, 1978, No. 4, (1 p.).

Primary Examiner—W. G. Saba
Attorney, Agent, or Firm—Douglas A. Lashmit; Melvin Sharp; N. Rhys Merrett

[57] ABSTRACT

A method for the fabrication of microelectronic semiconductor circuits, including the concurrent low pressure deposition of monocrystalline and polycrystalline semiconductor material in a predetermined pattern. In a preferred embodiment, a dielectric isolated circuit is fabricated, by such selective epitaxial growth, and a subsequent oxidation of both the mono- and polycrystalline deposits. By controlling the ratio of the deposition rates, and by controlling the oxidation step, the poly deposit is substantially fully converted to oxide, while the mono is only partly oxidized, leaving a substantially coplanar, isolated matrix of passivated monocrystalline areas in which to fabricate circuit components for interconnection.

5 Claims, 4 Drawing Figures

FABRICATION OF DIELECTRICALLY ISOLATED MICROELECTRONIC SEMICONDUCTOR CIRCUITS UTILIZING SELECTIVE GROWTH BY LOW PRESSURE VAPOR DEPOSITION

This invention relates to microelectronic semiconductor circuits, and more particularly to a method for the fabrication of such circuits wherein selected components or groups of components are separated from each other by dielectric isolation.

In the fabrication of microelectronic semiconductor circuits, the ability to isolate components from one another is a fundamental requirement. However, the continually increasing speed and lower power requirements of integrated circuits has made necessary the development of new isolation techniques characterized by advantages not obtainable with PN junction isolation.

Accordingly, it is an object of the present invention to provide a fabrication method capable of yielding a circuit having improved isolation characteristics. More specifically, it is an object of the invention to provide dielectric isolation in a manner that is compatible with increased circuit densities and which also reduces the prior requirement for strict epitaxial thickness tolerances and which provides a more precise control of the spacing between isolated component areas.

One aspect of the invention is embodied in a method for the fabrication of a semiconductor device, beginning with the step of forming a patterned layer of an insulator on the surface of a monocrystalline semiconductor body. The insulator pattern and the exposed semiconductor areas are then contacted with a vaporous or gaseous semiconductor compound, at reduced pressure, at a temperature sufficiently elevated to cause selective epitaxial deposition of monocrystalline semiconductor on the exposed semiconductor areas, and the concurrent deposition of polycrystalline semiconductor on the insulator pattern.

For example, a layer of silicon nitride is deposited upon a wafer of monocrystalline silicon, followed by the photolithographic patterning of the nitride layer to form windows therein at locations where it is desired to form monocrystalline epitaxial areas; isolated from each other by a dielectric material. The silicon wafer having a nitride pattern thereon is placed in an epitaxial growth reactor, and exposed to a vaporous or gaseous compound such as trichlorosilane, at pressures in the range of 1 to 100 Torr at temperature between 600 and 1500° C. The resultant deposition of elemental silicon occurs, such that monocrystalline epitaxial growth is formed in the windows, while concurrent deposition of polycrystalline silicon occurs on the nitride pattern.

Another aspect of the invention is embodied in a method for the fabrication of a semiconductor device, also beginning with the step of forming a patterned layer of silicon nitride on the surface of a monocrystalline silicon body. The body and patterned layer are then contacted at subatmospheric pressure with a vaporous or gaseous semiconductor compound at a temperature sufficiently elevated to cause selective epitaxial deposition of monocrystalline semiconductor on said body, and concurrent deposition of polycrystalline semiconductor on the patterned insulator.

The deposition process is controlled so that the ratio of the monocrystalline growth rate to the polycrystalline growth rate is substantially greater than 1, and preferably within a range of 1.2 to 2.0. The concurrent deposition of monocrystalline and polycrystalline semiconductor is continued until the single crystal deposit becomes substantially thicker than the combined thickness of the nitride plus the polycrystalline semiconductor deposited thereon.

The combined deposits are then subjected to controlled oxidation until the polycrystalline deposit is substantially fully oxidized, at which time the surface of the oxidized monocrystalline semiconductor becomes substantially coplanar with the oxide surface of the oxidized polycrystalline material.

The resulting matrix of passivated monocrystalline areas is then subjected to further processing for the fabrication therein of circuit components and the subsequent interconnection of such components to complete the integrated circuit.

The ratio of the monocrystalline semiconductor growth rate to the polycrystalline semiconductor growth rate is controlled by coordinating the temperature and pressure within the deposition reactor. For example, a pressure of 80 Torr and a temperature of 1070° C. provides a monocrystalline silicon growth rate of about 3000 angstroms per minute and a polysilicon growth rate of about 1500 angstroms per minute, which corresponds to a growth rate ratio of 2:1.

Since the growth rate of single crystalline silicon substantially exceeds the growth rate of polycrystalline silicon on the silicon nitride pattern, the thickness of the monocrystalline epitaxial deposit rapidly approaches the combined thickness of the nitride layer plus the polycrystalline silicon deposited thereon. Continued growth causes the surface of the single crystal deposit to rise above the adjacent surface of the polycrystalline deposit.

The combined deposits are then oxidized at >500° C. in an atmosphere of steam and oxygen. The polycrystalline deposit oxidizes more rapidly than the monocrystalline deposit, the rate of poly oxidation being primarily a function of its grain size, i.e., the smaller the grain size, the faster the oxidation rate. Consequently, the increased volume of the polycrystalline oxide is much greater than the increased volume of the monocrystalline oxide, such that the two oxide surfaces become coplanar as the polycrystalline material becomes fully oxidized. The resulting matrix of passivated monocrystalline areas, isolated by the surrounding oxide/nitride areas, is then subjected to further processing for the fabrication of circuit components in the monocrystalline areas and subsequent interconnection of such components to complete the integrated circuit.

FIGS. 1-4 are greatly enlarged cross sectional views of a silicon wafer and various sequential stages of fabrication in accordance with a preferred embodiment of the present invention.

In FIG. 1, a monocrystalline silicon wafer 11 having lightly doped p-type conductivity is subjected first to a selective doping operation in accordance with known methods to provide optional p+ regions 12 which serve as channel stops in the final structure. Next, a silicon nitride layer 13 is deposited over the entire surface of the wafer. The nitride layer is deposited in accordance with known techniques to a thickness of 100 to 1000 angstroms, preferably about 600 angstroms.

Figure 2:
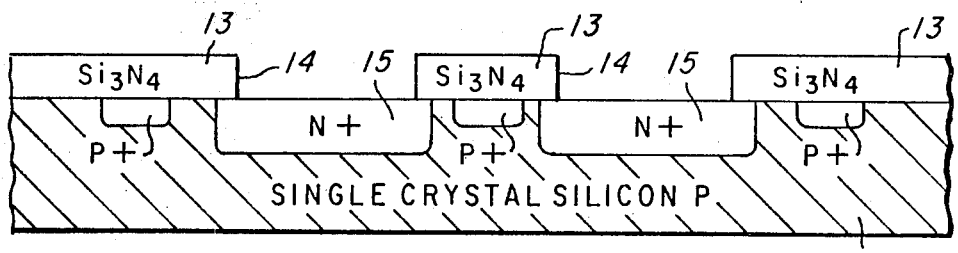

In FIG. 2 the wafer is illustrated after a selective etching procedure to provide windows 14 in the silicon nitride at which locations devices are to be fabricated. Then, preferably, n+ regions 15 are formed by selective diffusion or implantation of phosphorous or antimony or As. These regions are to function as the "buried film" of known bipolar circuit design.

Figure 3:
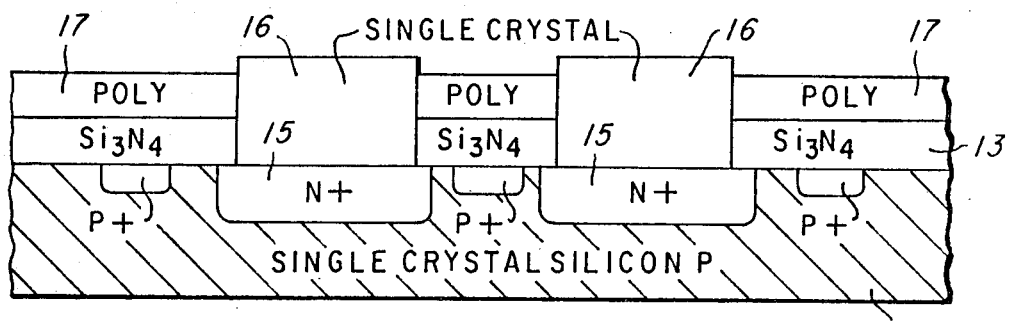

In FIG. 3 the wafer is illustrated after exposure to a vaporous or gaseous silicon compound such as dichlorosilane of trichlorosilane at a temperature of 1070° C. for eight minutes at a subatmospheric pressure of 80 torr. The resulting monocrystalline growth 16 is about 2 microns thick, while the combined thickness of nitride 13 and polycrystalline deposit 17 is only 1.8 microns.

Low pressure chemical vapor deposition process parameters such as carrier gas options, carrier gas flow rates and source molar fraction options are well known in the art. A discussion of these basic principles and the type and source of deposition equipment may be found in "Kinetics of Silicon Growth under Low Hydrogen Pressure", J. Electrochem. Soc., Vol. 125, No. 4, pp. 637–644, April 1978, and "Low Pressure Chemical Vapor Deposition for Very Large-Scale Integration Processing—A Review", IEEE Trans. on Electron Devices, Vol. Ed-26, No. 4 pp.647–657, April 1979 which are incorporated by reference.

Figure 4:
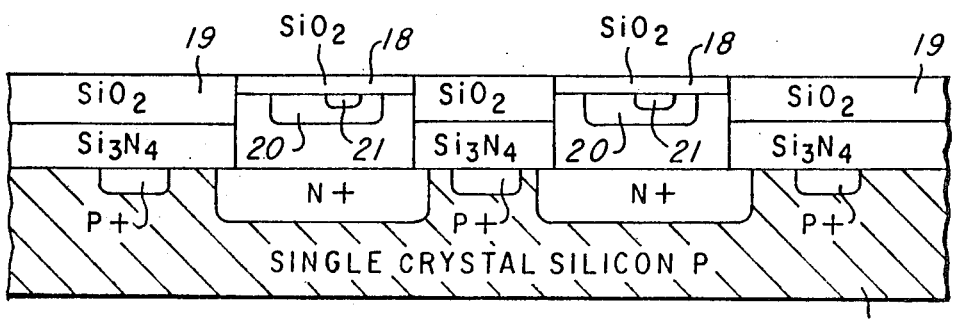

In FIG. 4 the wafer is shown after oxidation to convert polycrystalline silicon regions 17 into $S_iO_2$ layers 19, while concurrently forming surface passivation oxide on monocrystalline regions 16. Oxide layers 18 and 19 thus become substantially coplanar, which facilitates subsequent fabrication of device components, and metallization patterning for interconnections, using known methods.

Other embodiments are contemplated within the scope of the following claims. For example, silicon oxide is a useful insulator, instead of silicon nitride, for layer 13, although not necessarily with equivalent results.

What is claimed is:

1. A method for the fabrication of a semiconductor device comprising the steps of:
    (a) forming a patterned layer of silicon nitride on the surface of a monocrystalline semiconductor body;
    (b) contacting said body and patterned layer with a vaporous or gaseous semiconductor compound at a pressure between 1 torr and 100 torr, at a temperature between 700° C. and 1420° C. to cause selective epitaxial deposition of monocrystalline semiconductor on said body, and concurrent deposition of polycrystalline semiconductor on said patterned layer;
    (c) controlling the ratio of mono to poly growth rates to obtain substantially faster growth of mono than poly;
    (d) continuing such growth until the single crystal deposit becomes substantially thicker than the combined thickness of the nitride plus the poly deposited thereon;
    (e) oxidizing the combined deposits, until the poly deposit is substantially fully oxidized, at which time the oxide surface of the oxidized mono becomes substantially coplanar with the oxide surface of the oxidized poly;
    (f) then fabricating one or more components in the mono deposit.

2. A method as in claim 1 wherein the thickness of the nitride is coordinated with the ratio of said growth rates, so that the mono surface rises 0.5 microns above the poly surface whenever the poly is 0.5 microns thick.

3. A method as in claim 1 wherein said pressure is 80 torr.

4. A method as in claim 1 wherein said temperature is 1070° C.

5. A method as in claim 1 wherein said insulator is silicon oxide or silicon nitride, and said semiconductor is silicon.

* * * * *